United States Patent [19]

Nitta et al.

[11] Patent Number: 5,424,093
[45] Date of Patent: Jun. 13, 1995

[54] METHOD OF MANUFACTURING ELECTRONIC ELEMENTS

[75] Inventors: Koichi Nitta; Michio Kaeriyama; Kazuma Kabuta; Haruo Hori; Masami Yamaguchi; Tadahiro Nakagawa, all of Nagaokakyo, Japan

[73] Assignee: Murata Mfg. Co., Ltd., Nagaokakyo, Japan

[21] Appl. No.: 247,523

[22] Filed: May 23, 1994

Related U.S. Application Data

[63] Continuation-in-part of Ser. No. 977,227, Nov. 16, 1992, abandoned.

[30] Foreign Application Priority Data

Nov. 15, 1991 [JP] Japan .................. 3-328055
Nov. 15, 1991 [JP] Japan .................. 3-328056

[51] Int. Cl.6 .................. B05D 5/12; B05D 1/18; B05D 1/36
[52] U.S. Cl. .................. 427/58; 427/96; 427/405; 427/436; 427/443.2
[58] Field of Search ............. 427/58, 96, 443.2, 436, 427/405

[56] References Cited

U.S. PATENT DOCUMENTS 4,859,498  8/1989  Yamaguchi .................. 427/96

FOREIGN PATENT DOCUMENTS 4208593  7/1992  Japan .

Primary Examiner—Shrive Beck
Assistant Examiner—Bret Chen
Attorney, Agent, or Firm—Ostrolenk, Faber, Gerb & Soffen

[57] ABSTRACT

A thick layer of electrode material paint is formed on a flat surface. A film of the electrode material paint is formed on an element by dipping the element into the layer. In the next step, a thinner layer of the electrode material paint than the aforementioned layer is formed on a flat surface. Into the thinner layer of the electrode material paint, the film of the electrode material paint formed on the element is dipped. Alternatively, the element may first be dipped into a thinner layer of the electrode material paint so that a thin film of the electrode material paint is formed on the element. The film formed on the element is then dipped into a thick layer of the electrode material paint and then again into a thin layer of the electrode material paint in such order. By firing the film of the electrode material paint obtained in this manner, an electronic element having external electrodes of a uniform thickness can be obtained.

16 Claims, 5 Drawing Sheets

F I G. 8
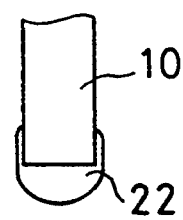
F I G. 9
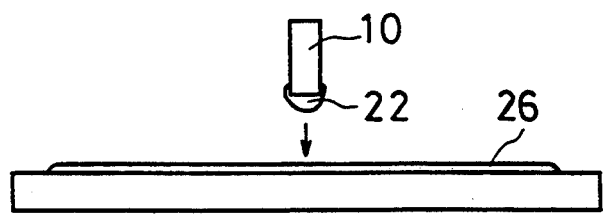
F I G. 10
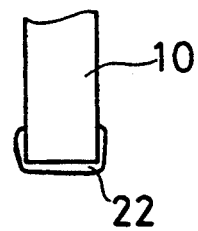

METHOD OF MANUFACTURING ELECTRONIC ELEMENTS

This is a Continuation-in-part of Application Ser. No. 07/977,227 filed on Nov. 16, 1992 now abandoned.

BACKGROUND OF THE INVENTION

1. Field of the Invention

The present invention relates to a method of manufacturing electronic elements and, more particularly, to a method of manufacturing electronic elements having external electrodes at their ends, such as laminated capacitors, chip resistors, and chip inductors.

Conventionally, in manufacturing electronic elements having external electrodes, an element 2 is dipped into a layer 1 of electrode material paint, as shown in FIG. 11. Thereby, a film 3 of the electrode material paint is formed at one end of the element 2, as shown in FIG. 12. By firing the element 2 having the film 3 of the electrode material paint, an electronic element having external electrodes is formed.

However, when such a method is used, the amount of the electrode material paint that is adhered to the element varies, and if the amount is too large, the thickness of the film 3 of the electrode material paint may sometimes become large, as shown in FIG. 12. When firing the element in such a condition, the external electrode of the electronic element becomes thicker than is necessary, and the cost of the electrode material rises. Furthermore, when the amount of the electrode material paint that is adhered to the element varies, the thickness of the external electrode of the electronic element also varies.

It has been considered that in order to remove an excessive amount of the electrode material paint that is adhered onto the element, the element is pressed on a flat surface having no electrode material paint layer, as shown in FIG. 13, and the excessive amount of the electrode material paint is removed and collected. However, in such a method, excess electrode material paint than is necessary could be removed, and the outer shape of the electrode could be distorted as shown in FIG. 14. Therefore, an external electrode having a uniform thickness can not be obtained. Moreover, in such a case, the external electrode could have an insufficient thickness, and thus a low level of heat resistance when soldered.

Furthermore, because electrode material paint of a relatively high viscosity is used, bubbles are sometimes formed on the under-surface of the element 2 when dipping the element 2 into the layer 1 of the electrode material paint. In this case, the electrode material paint can not discharge the bubbles on the under-surface of the element 2 when the element 2 is pulled up from the layer 1 of the electrode material paint, and thus a void 4 sometimes remains in the film 3 as shown in FIG. 15. It is frequently difficult to remove such a void even when dipping of the element 2 is repeated several times into the electrode material paint. If the element in such a condition is fired, voids remain in the external electrode of the electronic element, and it is difficult to locate out these voids from the outside. Sometimes, silver elution from the external electrode occurs due to consumption of silver when the external electrode is soldered to a printed circuit board, and a defect of connection frequently becomes evident. And, it is only after such a condition takes place that the defect of the electronic element is found.

SUMMARY OF THE INVENTION

Therefore, it is an object of the present invention to provide a method of manufacturing an electronic element with an external electrode having a relatively uniform thickness.

It is another object of the invention to provide a method of manufacturing an electronic element which does not cause the formation of a void in the external electrodes.

The present invention is directed to a method of manufacturing an electronic element having an external electrode formed at an end thereof, the external electrode having a side portion that extends a predetermined distance from the end along a surface of the electronic element. The method includes the steps: (a) providing an element; (b) forming a first layer of electrode material paint, having a first predetermined thickness that corresponds to the size of the side portion of the external electrode, for dipping an end of the element so that a film is formed at the end of the element; (c) dipping the end of the element into the first layer of electrode material paint so that the end reaches to the bottom of the first layer of electrode material paint; (d) forming the film of electrode material paint at the end by pulling the end up from the first layer of electrode material paint; (e) forming a second layer of electrode material paint, having a second predetermined thickness no more than half the first predetermined thickness of the first layer, for dipping the film formed on the end in step (d); (f) dipping the end of the element having the film into the second layer of electrode material paint so that the end of the element reaches to the bottom of the second layer of electrode material paint; and (g) pulling the end of the element up from the second layer of electrode material paint so that an excess quantity of electrode material paint is removed, thereby forming an external electrode having substantially uniform thickness.

An excessive amount of the electrode material paint that is adhered to the element is removed and collected by the second layer of the electrode material paint, which is thinner than the first layer. At this time, the electrode material paint that is adhered to the element is not removed, in excess of necessity, by providing the second layer of the electrode material paint.

According to the present invention, the electrode material paint that is adhered to the element is appropriately removed, and a film of the electrode material paint having a relatively uniform thickness can be formed at the ends of the element. Thereby, an electronic element having external electrodes with less variation in thickness can be obtained.

According to another embodiment of the present invention, a third layer of electrode material paint is formed having a thickness that is less than the predetermined thickness of the first layer, and the end of the element is dipped into the third layer of electrode material paint before the step (c) described above.

A film of the electrode material paint is formed on the element first by dipping the element into a thin layer of the electrode material paint without generating bubbles. Then, a film of the electrode material paint having a necessary thickness is formed by dipping the film on the element into another layer of the electrode material paint that is thicker than the previous layer. At this time, because the film of the electrode material paint has been already formed at the end of the element, an affinity between the film and the electrode material paint of the thicker layer becomes good.

According to the present invention, the affinity between the film of the electrode material paint formed first on the element and the electrode material paint of the thicker layer is good, and thus the film of the electrode material paint can be formed without generating voids. Moreover, the electrode material paint adhered to the element after dipping in the thicker layer is appropriately removed by a next thinner layer of the electrode material paint, and thus a film of the electrode material paint having a relatively uniform thickness can be formed on the end of the element. Therefore, an electronic element with external electrodes having no void and a less varied thickness can be obtained by firing an element coated with the electrode material paint.

The above-mentioned and further objects, features, aspects and the advantages of the invention will more fully be apparent from the following detailed description of the embodiments with the accompanying drawings.

BRIEF DESCRIPTION OF THE DRAWINGS

FIG. 8 is an illustrative view showing the state of a film of the electrode material paint obtained from the process of FIG. 7.

FIG. 9 is an illustrative view showing a process of dipping the film of FIG. 8 into a thin layer of the electrode material paint.

FIG. 10 is an illustrative view showing the state of the film of the electrode material paint obtained from the process of FIG. 9.

DESCRIPTION OF THE PREFERRED EMBODIMENTS

Figure 1:
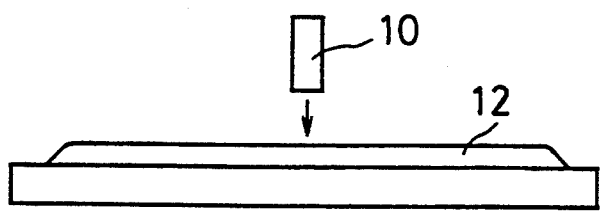
FIG. 1 is an illustrative view showing a process of dipping an element into a thick layer of electrode material paint.

FIGS. 1–4 are illustrative views showing steps of a method of the present invention. First, an element 10 is prepared as shown in FIG. 1. As an example of the element 10, laminated capacitors are used. The element for the laminated capacitor is formed by laminating green sheets, which are made of dielectric ceramic materials, and internal electrodes, and then firing them. In this case, the element is formed in such a way that a plurality of the internal electrodes are disposed in opposition to each other and they are alternately exposed at both ends of the dielectric ceramics.

Then, a first layer 12 of electrode material paint is formed by flowing on a flat surface the electrode material paint for external electrodes. As the electrode material paint, a mixture of silver, glass and solvent is used for example. In addition, in order to avoid elution of silver due to silver consumption when soldering the external electrodes, a small amount of palladium may be added to the mixture. The thickness of the first layer 12 of the electrode material paint is set by matching it to the dimensions of the external electrode that is to be formed at the end of the element. In this embodiment, the thickness of the first layer is formed so as to be 0.7 mm for example.

Figure 2:
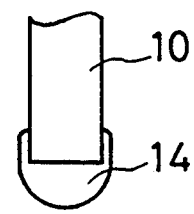
FIG. 2 is an illustrative view showing the state of a film of the electrode material paint obtained from the process of FIG. 1.

Then, the end of the element 10 is dipped into the first layer 12 of the electrode material paint. Thereby, as shown in FIG. 2, the electrode material paint is adhered to the end of the element 10, and a film 14 of the electrode material paint is formed.

Figure 3:
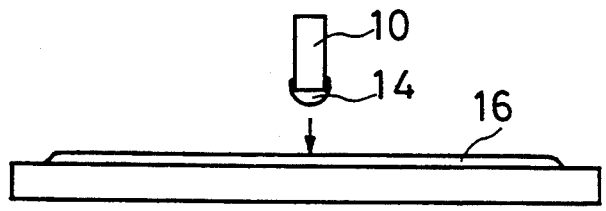
FIG. 3 is an illustrative view showing a process of dipping the film of Fig. 2 into a thin layer of the electrode material paint.

Furthermore, as shown in FIG. 3, a second layer 16 of the electrode material paint is formed on a flat surface. The second layer 16 is formed so that it is thinner than the first layer 12. In this embodiment, the thickness of the second layer 16 of the electrode material paint is set so as to be 0.05–0.3 mm. The thickness of the second layer 16 is determined depending upon a viscosity of the electrode material paint and dimensions of the element.

Then, the electrode material paint film 14 formed on the element 10 is dipped into the second layer 16 of the electrode material paint. As shown in FIG. 2, even if the electrode material paint is abundantly adhered to the element 10 and the thickness of the film 14 is relatively large, an excessive amount of the electrode material paint is dropped and removed by dipping the film 14 into the second layer 16. In this case, the electrode material paint is not removed, beyond necessity, due to existence of the second layer 16 as different from the case in which the electrode material film 14 of the element 10 is pressed to a flat surface having no electrode material paint layer. In addition, because the second layer 16 of the electrode material paint is thinner than the first layer 12, the electrode material paint does not transfer from the second layer 16 to the film 14 .of the element 10.

Without being bound by theory, the element 10 is dipped into the first layer 12 so that the end of the element 10 reaches to the bottom of the layer 12. As the element 10 is then pulled up from the layer 12 to form a film on the element 10, the electrode material paint that surrounds the end of the element 10 flows under the end of the element 10.

When the layer of electrode material paint into which the element 10 is dipped is thick (as shown in FIG. 1), a relatively longer time is required to pull the element 10 up from the layer 12. Therefore, a greater amount of the electrode material paint is able to flow under the end of the element 10 even though the rate of flow of the electrode material paint is slow and the additional electrode material paint is raised up with the end of the element 10 (as shown in FIG. 2) thereby providing an excess amount of paint at the end of the element 10.

On the other hand, when the layer of electrode material paint is thin (as shown in FIG. 3), the time required to pull the element 10 up from the layer 16 is short. Therefore, the electrode material paint is not able to flow under the end of the element 10 and additional electrode material paint is not raised up with the end of the element 10 as tends to happen when the thicker layer 12 is used. It has been found by the inventors, that by these steps the excess paint formed at the end of the element 10, when it is dipped in the thicker layer 12, is removed by using the thinner layer 16.

In the present invention, the thicker layer 12 is used for determining the size of the side portion of the electrode to be formed on the element 10, and the thinner layer 16 is used for removing the excess paint. The thickness of the film 14 is determined by the rheology characteristics of the electrode material paint. A uniform thickness of the film 14 is obtained even though electrode material paints having different viscosities are used. However, the same electrode material paint may also be used for the respective layers.

Figure 4:
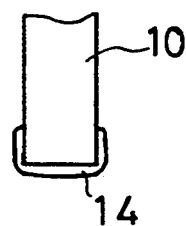
FIG. 4 is an illustrative view showing state of a film of the electrode material paint obtained from the process of FIG. 3.

Therefore, as shown in FIG. 4, the electrode material paint film 14 is made so as to have a relatively uniform thickness and a small variation of it. Thus, an electronic element with external electrodes having a relatively uniform thickness can be obtained.

Figure 5:
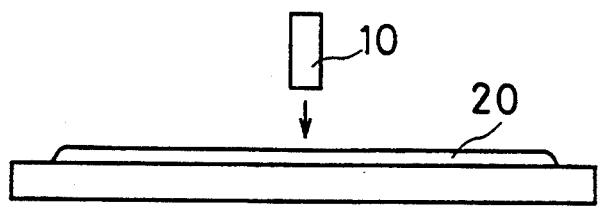
FIG. 5 is an illustrative view showing another embodiment of the invention which includes a process of dipping an element into a thin layer of the electrode material paint.

Still furthermore, in order to obtain an electronic element having no void in the external electrodes, a first thin layer 20 of the electrode material paint is formed on a flat surface as shown in FIG. 5. In this embodiment, the first layer 20 of the electrode material paint is formed so that it has a thickness of 0.4 mm for example.

Figure 6:
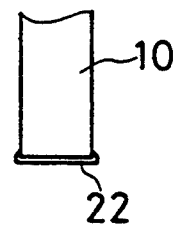
FIG. 6 is an illustrative view showing the state of a film of the electrode material paint obtained from the process of FIG. 5.

Then, the end of the element 10 is dipped into the first layer 20 of the electrode material paint. Thereby, the electrode material paint is adhered to the end of the element 10 as shown in FIG. 6, and thus an electrode material paint film 22 is formed. The first layer 20 of the electrode material paint is made thin, so that bubbles scarcely arise when the element 10 is dipped into the first layer 20. Even if bubbles arise, they are pushed out to side portions of the element 10. Therefore, at this time, the film 22 having no void is formed by using a small amount of the electrode material paint.

Figure 7:
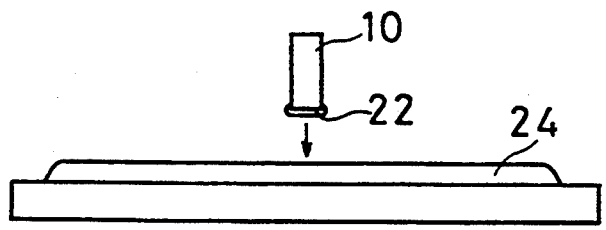
FIG. 7 is an illustrative view showing a process of dipping the film of FIG. 6 into a thick layer of the electrode material paint.
Figure 11:
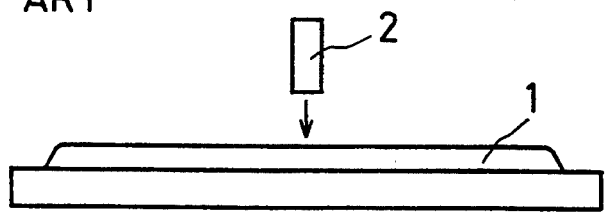
FIG. 11 is an illustrative view showing a conventional method of manufacturing an electronic element which includes a process of dipping an element into the electrode material paint.
Figure 12:
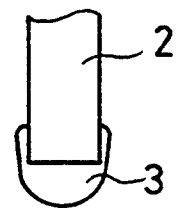
FIG. 12 is an illustrative view showing the state of the film of the electrode material paint obtained from the process of FIG. 11.
Figure 13:
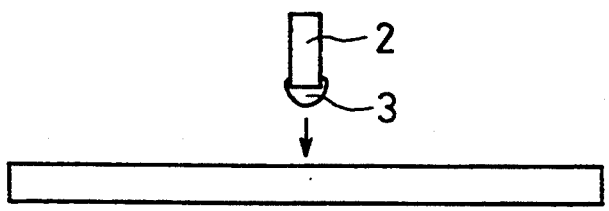
FIG. 13 is an illustrative view showing a process of removing the electrode material paint when a film formed on an element is thick.
Figure 14:
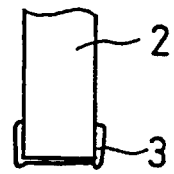
FIG. 14 is an illustrative view showing the state of a film of the electrode material paint obtained from the process of FIG. 13.
Figure 15:
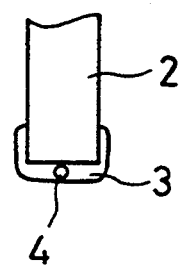
FIG. 15 is an illustrative view showing the state of generation of a void in a film of the electrode material paint formed by the conventional method of manufacturing the electronic element.

Then, a second layer 24 of the electrode material paint is formed on a flat surface as shown in FIG. 7. The thickness of the second layer 24 is formed by matching it to the dimensions of the external electrode of the electronic element. Therefore, the second layer 24 of the electrode material paint is made so as to be thicker than the first layer 20. In this embodiment, the second layer 24 of the electrode material paint is set so as to be 0.7 mm.

The end of the element 10 is dipped into the second layer 24 of the electrode material paint along with the film 22 of the electrode material paint formed at the end of the element 10. Thereby, the thick film 22 of the electrode material paint is formed as shown in FIG. 8. At this time, the element 10 is previously provided with the film of the electrode material paint, and thus has a good affinity for the second layer 24 of the electrode material paint and scarcely has a void.

Still further, the film 22 of the element 10 is dipped into a third layer 26 of the electrode material paint as shown in FIG. 9. The third layer 26 of the electrode material paint is made so as to be thinner than the second layer 24. In this embodiment, the thickness of the third layer 26 is set to about 0.1 mm. An excessive amount of the electrode material paint of the film 22 on the element 10 is dropped and removed and then collected by the third layer 26 of the electrode material paint. Therefore, as shown in FIG. 10, the film 22 of the electrode material paint can have a relatively uniform thickness, and thus an electronic element obtained in such a manner can have less varied sizes of electrodes.

Thus, an electronic element without voids in its external electrodes can be obtained by firing the film 22 of the electrode material paint.

When using the method of the invention in this way, voids are prevented in forming the film 22 of the electronic material paint on the element 10. Therefore, the electronic element obtained by firing the element 10 also has external electrodes containing no void. Thus, electronic elements including less defects can be obtained by using a method of the invention.

By the way, it is needless to say that the method of manufacturing these electronic elements can be applied to all other electronic elements having external electrodes such as chip resistors and chip inductors without being limited to laminated capacitors.

It will be apparent from the foregoing that, while the present invention has been described in details and illustrated, these are only given as particular illustrations and examples and the invention is not limited to these. The spirit and scope of the invention are limited only by the appended claims.

What is claimed is:

1. A method of manufacturing an electronic element having an external electrode formed at an end thereof, said external electrode having a side portion that extends from said end along a surface of said electronic element, the method comprising the steps of:

(a) providing an element;

(b) forming a first layer of electrode material paint, having a first thickness that corresponds to the size of said side portion of said external electrode, for dipping an end of said element so that a film is formed at said end of said element;

(c) dipping said end of said element into said first layer of electrode material paint so that said end reaches to the bottom of said first layer of electrode material paint;

(d) forming the film of electrode material paint at said end by pulling said end up from said first layer of electrode material paint;

(e) forming a second layer of electrode material paint, having a second thickness that is no more than half said first thickness of said first layer, for dipping said film formed at said end in step (d);

(f) dipping said end of said element having said film into said second layer of electrode material paint so that said end reaches to the bottom of said second layer of electrode material paint; and (g) pulling said end up from said second layer of electrode material paint so that an excess quantity of said electrode material paint is removed, thereby forming an external electrode having substantially uniform thickness.

2. A method of manufacturing an electronic element according to claim 1, which further comprises the steps of:

forming a third layer of electrode material paint having a third thickness that is less than said first thickness of said first layer; and dipping said end of said element into said third layer of electrode material paint before step (c).

3. A method of manufacturing an electronic element according to claim 2, wherein said first thickness of said first layer of electrode material paint is about 0.7 mm, said second thickness of said second layer of electrode material paint is about 0.1 mm and said third layer of electrode material paint has a thickness of about 0.4 mm.

4. A method of manufacturing an electronic element according to claim 3, wherein said electrode material paint is produced by the step of mixing silver, glass and solvent.

5. A method of manufacturing an electronic element according to claim 2, wherein said first layer, said second layer and said third layer are each formed of the same electrode material paint.

6. A method of manufacturing an electronic element according to claim 2, wherein each of said first, second and third layers of the electrode material paint is formed on a flat surface.

7. A method of manufacturing an electronic element according to claim 2, wherein said electrode material paint is produced by a step of mixing silver, glass and solvent.

8. A method of manufacturing an electronic element according to claim 7, wherein palladium is further added to said electrode material paint.

9. A method of manufacturing an electronic element according to claim 1, wherein as a result of step (g), said external electrode formed on said element is caused to be substantially free from voids.

10. A method of manufacturing an electronic element according to claim 1, wherein said first thickness of said first layer of electrode material paint is about 0.7 mm.

11. A method of manufacturing an electronic element according to claim 1, wherein the second thickness of said second layer of electrode material paint is about 0.05 to 0.3 mm.

12. A method of manufacturing an electronic element according to claim 11, wherein said electrode material paint is produced by the step of mixing silver, glass and solvent.

13. A method of manufacturing an electronic element according to claim 1, wherein said first layer and said second layer are each formed of the same electrode material paint.

14. A method of manufacturing an electronic element according to claim 16, wherein said electrode material paint is produced by a step of mixing silver, glass and solvent.

15. A method of manufacturing an electronic element according to claim 14, wherein palladium is further added to said electrode material paint.

16. A method of manufacturing an electronic element according to claim 1, wherein each of said first and second layers of the electrode material paint is formed on a flat surface.

* * * * *